United States Patent [19]

Chenier

[11] 4,456,875
[45] Jun. 26, 1984

[54] DEMAGNETIZATION CIRCUIT FOR CURRENT TRANSFORMERS

[75] Inventor: Andre Chenier, Beloeil, Canada

[73] Assignee: Hydro-Quebec, Montreal, Canada

[21] Appl. No.: 347,565

[22] Filed: Feb. 10, 1982

[30] Foreign Application Priority Data

Jul. 7, 1981 [CA] Canada ................... 381253

[51] Int. Cl.³ ...................... G01R 11/52; G01R 27/26
[52] U.S. Cl. .................................................. 324/55
[58] Field of Search ................. 324/211, 222, 223, 55

[56] References Cited

U.S. PATENT DOCUMENTS

| 2,934,696 | 4/1960 | Williams | 324/223 X |
| 3,358,224 | 12/1967 | Mogilevski | 324/223 |
| 3,543,155 | 11/1970 | Maddox | 324/211 X |

FOREIGN PATENT DOCUMENTS

| 1204328 | 11/1965 | Fed. Rep. of Germany | 324/211 |
| 2131883 | 6/1971 | Fed. Rep. of Germany | 324/55 |
| 0318892 | 12/1971 | U.S.S.R. | 324/211 |
| 0624181 | 9/1978 | U.S.S.R. | 324/222 |
| 0705396 | 12/1979 | U.S.S.R. | 324/211 |

OTHER PUBLICATIONS

Maczenski et al: "Current Pulse Generator for Measuring Square-Loop Ferromagnetics..." Elektronika-No. 9, 1970 [Poland].

*Primary Examiner*—Stanley T. Krawczewicz
*Assistant Examiner*—Jose M. Solis
*Attorney, Agent, or Firm*—Burns, Doane, Swecker & Mathis

[57] ABSTRACT

The invention relates to a method and a system for measuring residual flux in current transformers. The system comprises a controlled circuit for generating two voltage levels for switching the current flow in the transformer. The switching circuit is connected to one current transformer winding and causes the induction to vary from the residual flux level to a saturation level through successive switching of the current when the voltage is applied across the winding terminals. A processing unit receives a first signal delivered by the switching circuit, such signal being representative of the induction variation for a time corresponding to the time period of the voltage. The processing unit further receives a signal representative of the induction variation caused by the application of the voltage for a second time period. The unit determines saturation levels corresponding to a positive variation and a negative variation of the induction as a function of the residual flux and generates a signal which corresponds to the residual flux of the current transformer.

14 Claims, 7 Drawing Figures

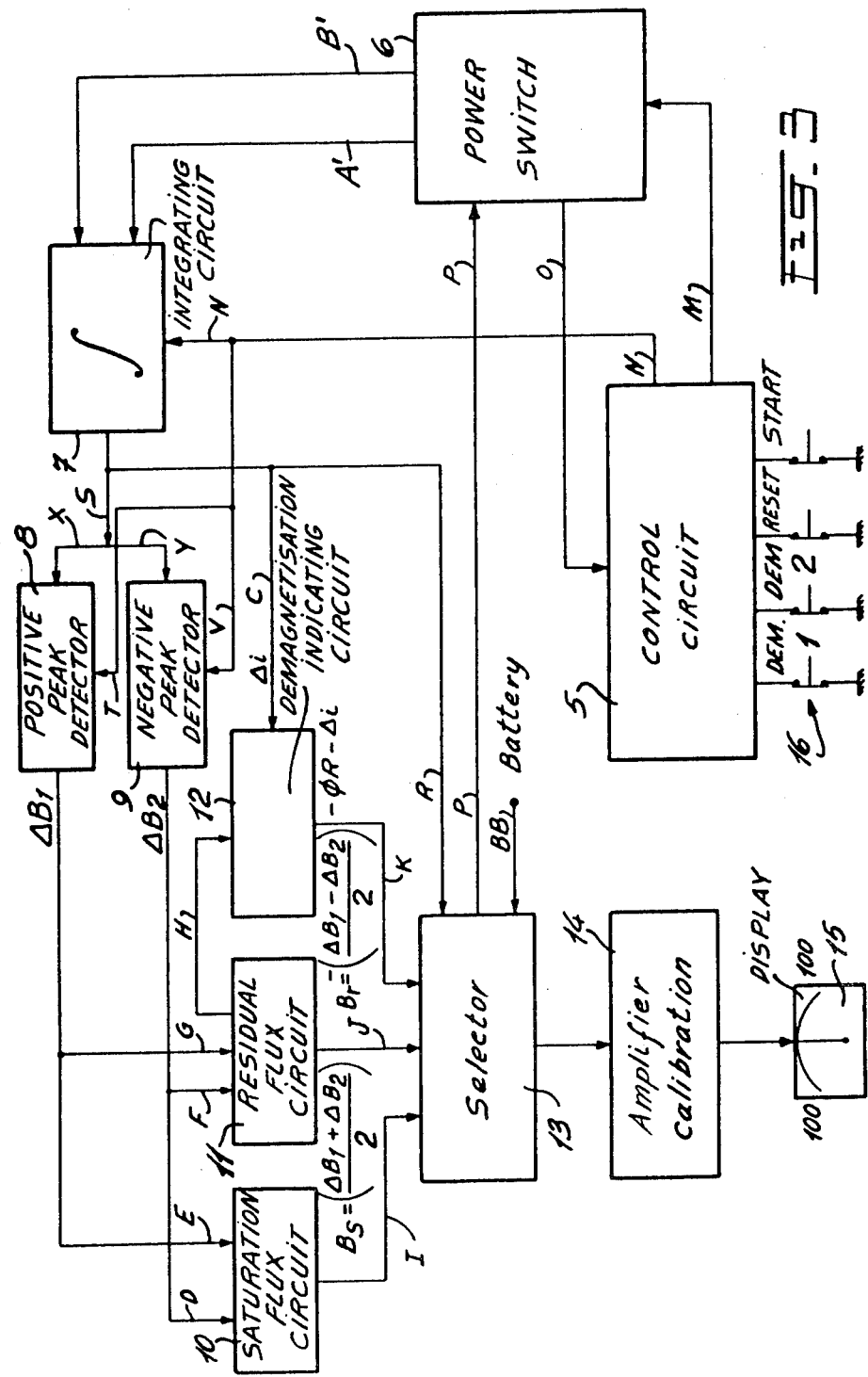

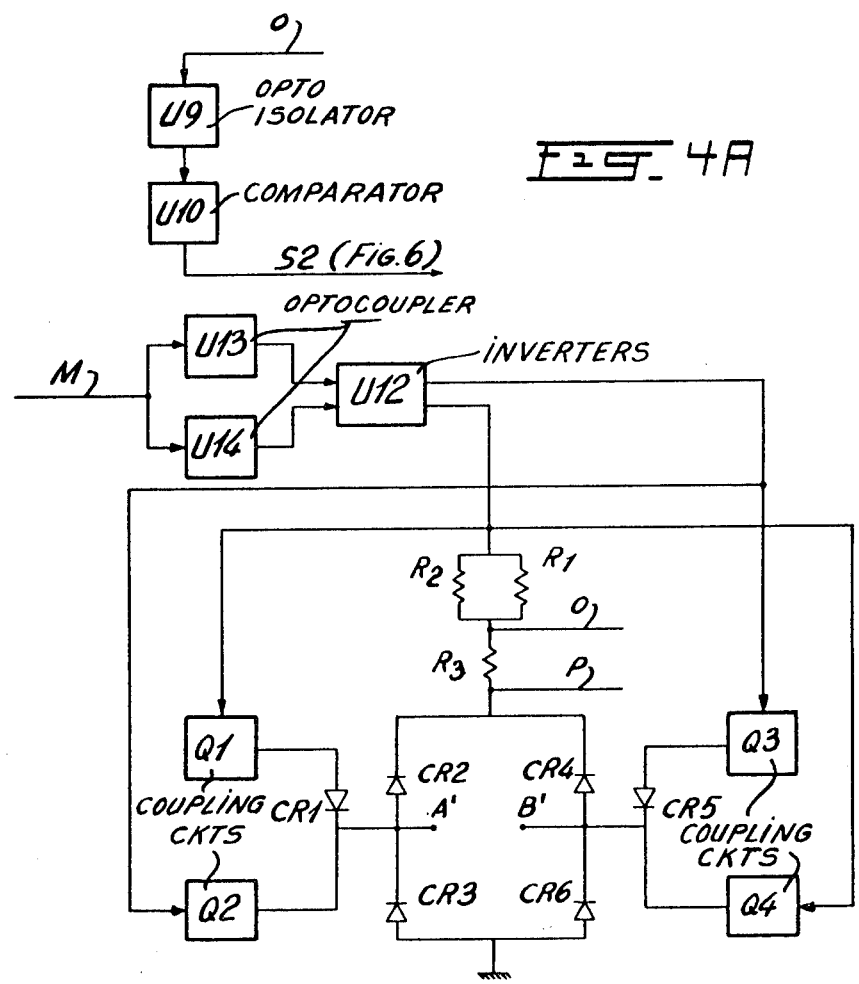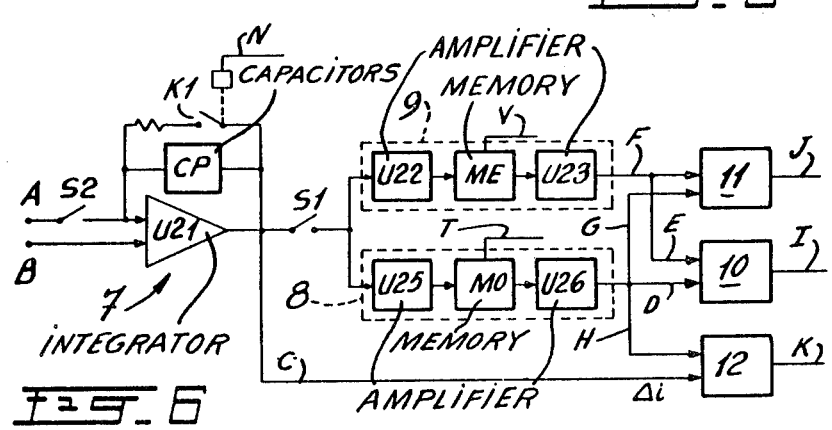

DEMAGNETIZATION CIRCUIT FOR CURRENT TRANSFORMERS

BACKGROUND OF THE INVENTION (a) Field of the Invention

The present invention relates to a system as well as a method for measuring the residual flux present in current transformers and more particularly concerns a method and a system for indicating in a direct manner the value of that residual flux. Moreover, in a preferred embodiment, the present invention incorporates a method and means for cancelling the residual flux through controlled demagnetization of the current transformer core.

(b) Description of Prior Art

It is well known that the presence of periodic components in a transient current causes, in a current transformer, an asymetrical development of flux or induction in the current transformer core while in the transient state. Under such conditions, the transformer core may be driven to saturation and then an error in the ratio of the current transformer may result. The probability of occurrence of such event is higher in the case of closed core transformers, that is with those without an air-gap, for reason of the presence therein of a permanent residual flux. The existence of such residual flux in the core of that type of transformer lowers the dynamic range available for asymetrical induction variations in the transient state. Moreover, in the transient state, during which the induction as raised to a high level after such transient state, a residual flux may be created which substantially reduces the dynamic range of the transformer.

A standard method for measuring the residual flux level in a core, onto which a winding is wound, includes measuring the voltage induced in that winding while the induction varies, and integrating the measured value by means of an electronic integrator. The output signal from the integrator is then approximately equal to the induction variation value from a starting level, which is not known. In that standard method, the starting level which corresponds to the residual flux level must be evaluated.

SUMMARY OF INVENTION

An object of the present invention is to provide a method and a system for directly measuring the residual flux in current transformers while eliminating the drawbacks inherent in standard techniques and providing a simple and relatively quick measuring method.

Therefore, the present invention is directed to a system for measuring the residual flux in a current transformer, comprising:

control circuit means generating a voltage waveform having two successive levels for reversing current flow in said current transformer, said control circuit means having a series resistance compensating circuit connected across the transformer winding and generating a stop signal to a processing unit upon detection of a predetermined current value flowing in said winding;

switching circuit means connected to said winding of said current transformer and producing an induction variation from the residual flux level up to saturation by successively switching the current when said voltage waveform is applied across the terminals of said winding; and said processing unit receiving from said switching circuit means a first analog signal representative of said induction variation caused by said voltage waveform generated in a first time period and a second analog signal representative of the induction variation caused by said voltage waveform generated in a second time period, said unit determining saturation levels corresponding to a positive variation and to a negative variation of the induction in relation with said residual flux, and generating a signal representative of said current transformer residual flux.

In addition, the present invention resides in a method for measuring the residual flux in a current transformer, comprising the steps of:

generating a voltage waveform having two successive levels for reversing current flow in said current transformer;

varying the induction level from a residual flux level up to saturation in one polarity and thereafter up to saturation in the other polarity by switching over said voltage waveform applied to a winding of said current transformer;

determining, by means of a processing unit, a variation value of the induction caused by the voltage waveform issued in the first time period and an induction value caused by a voltage waveform issued in the second time period and summing up said induction values whereby to obtain a resultant analog signal representative of said residual flux in said transformer;

said processing unit having a control circuit comprising a series resistance compensating circuit connected across the transformer winding, and generating a stop signal to a processing unit upon detection of a current value flowing in said winding.

According to a preferred embodiment of the present invention, there is further provided a demagnetization circuit capable of bringing the residual flux level to a null value. This is achieved by injecting, through the transformer winding, a direct current being of either a positive value or of a negative value whether the residual flux has a negative or a positive value, respectively. Moreover, the demagnetization is carried out under complete control since the injection of the direct current impulses is followed by a checking operation to verify the remaining residual induction level, until a null residual flux level is reached.

As far as the demagnetization process of the current transformer core is concerned, the standard method previously utilized consisted of applying a 60 hertz A.C. voltage across the current transformer winding by means of an overvoltage transformer and a variable auto-transformer. With that method, the power necessary to demagnetise completely the transformer core is of about 2,000 watts. By means of the variable auto-transformer, the hysteresis curve of the transformer core extend from saturation down to a null current. Such a standard method has the inconvenience of requiring very cumbersome and bulky equipments which are furthermore considered risky because of the high voltage required and it does not provide any quantitative indication of the residual flux level during the demagnetization process.

BRIEF DESCRIPTION OF DRAWINGS

A preferred embodiment of the present invention will be hereinafter described with reference to the accompanying drawings, wherein:

FIG. 3 is a block diagram showing the measuring system as well as the demagnetizing system for the current transformer core;

FIGS. 4 and 4a schematically show the control circuit which is part of the measuring system of FIG. 3;

FIG. 5 is a block diagram of the power switching unit used in the measuring system of FIG. 3; and FIG. 6 shows the arrangement of the integrator and of the peak detectors illustrated in FIG. 3.

DESCRIPTION OF PREFERRED EMBODIMENTS

Figure 1:
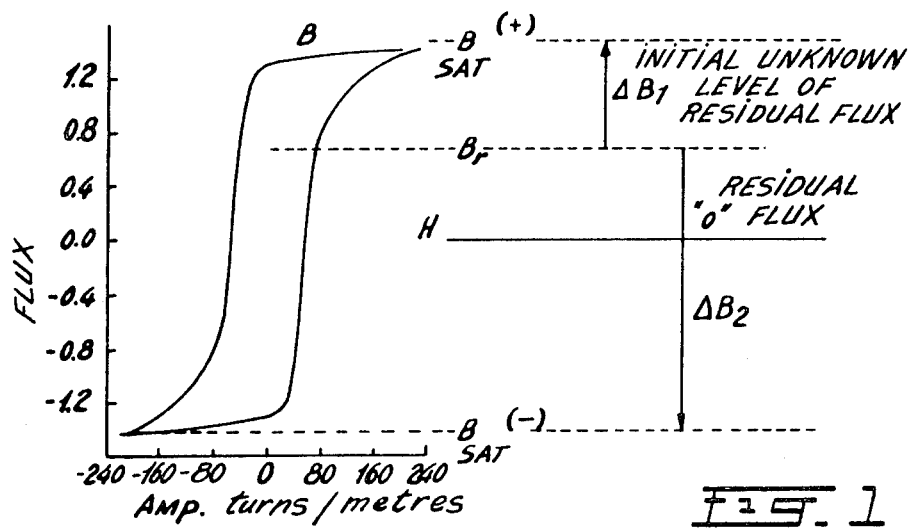
FIG. 1 is a schematic illustration of a current transformer hysteresis curve wherein there is residual flux in the transformer core to illustrate the principle onto which is based the method and the operating concept of the present invention.

FIG. 1 schematically shows the technique or the principle onto which is based the method and the system of the present invention in order to determine and measure the residual flux level of a current transformer core. As illustrated, the current transformer is brought to positive saturation $B_{sat}+$ and to negative saturation $B_{sat}-$, that is, two saturation levels corresponding to the positive polarity and negative polarity of the core according to the normal permeability characteristics thereof. Saturation of the core in either polarities is achieved by successively applying a two levels of voltage across the terminals of the transformer winding so as to obtain a positive variation value $\Delta B_1$ and a negative variation value $\Delta B_2$ of the induction as a function of the residual flux level Br which is unknown and present in the transformer core. This may be expressed by the following formulas:

$$Br + \Delta B_1 = B_{sat}+$$

$$Br - \Delta B_2 = B_{sat}-$$

According to the positive and negative saturation levels of a magnetization hysteresis curve of the transformer core, the induction saturation value is then given by:

$$B_{sat}+ = -B_{sat}-$$

$$B_{sat}+ = (\Delta B_1 + \Delta B_2)/2$$

Knowing the value representative of the induction variations in relation to the initial residual flux level Br, a measure of the latter is obtained as follows:

$$Br = -(\Delta B_1 - \Delta B_2)/2$$

Figure 2:
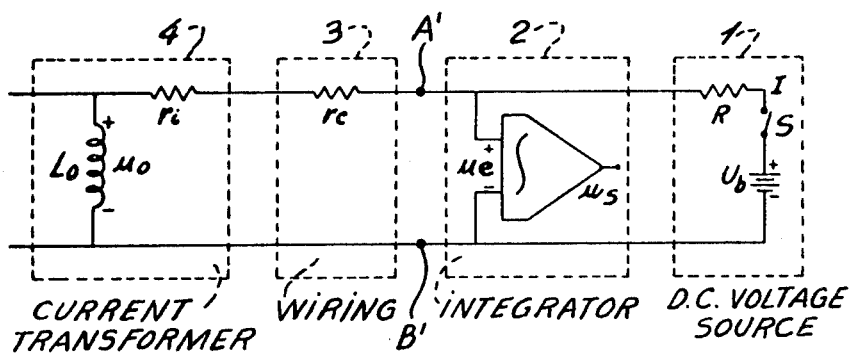
FIG. 2 is a schematic diagram showing the basic principle of the present invention.

Referring to FIG. 2, there is illustrated a basic principles of the actual measuring system. As shown, a supply source 1 including a battery Ub and a switch S delivers a current I through the wiring resistance $r_c$ and through the winding of the current transformer 4 having an internal resistance $r_i$. A potential drop $u_o$ appears across the transformer terminals A' and B', thereby giving rise to a voltage $u_e$. An integrating unit 2 is connected across the terminals A' and B' and supplies an output voltage signal $u_s$ proportional to the induction B. A measure of that induction B is obtained through the following equation while assuming that the switch s is closed at time t=0:

$$B = \frac{1}{NA} \int_0^t u_o \, dt$$

where:
N: number of turns of the secondary
A: section of the magnetic core (m²)

$$u_o = (u_e - (r_c + r_i) i)$$

Si $(r_c + r_i) i\, u_o, u_o = u_e$ and $B = \frac{1}{NA} \int_0^t u_e \, dt$

The condition $(r_c + r_i) i\, u_e$ may be achieved as long as the core is not saturated ($L_o$ large)

$$u_s = \frac{1}{K} \int_0^t u_e \, dt = \frac{1}{K}$$

NAB or K: constant of the integrator $$B = K \frac{u_s}{NA}$$

It is to be noted that the variations in induction required to determine the residual flux may be obtained by applying a low D.C. voltage through the secondary winding of the transformer. In that case, it is noted that the current flowing through the winding has to be high enough as to achieve saturation of the transformer core. However, that current is limited so that the voltage drop across the winding and the wiring circuit does not alter the voltage value applied when the switch S of the supply circuit is closed.

Referring now to FIG. 3, there is illustrated a block diagram of the elements forming the residual flux measuring system operating in accordance with the principle described above. It is to be noted that the system shown in FIG. 3 provides all elements capable of completely demagnetizing the current transformer core so that the demagnetizing circuit as well as the associated method will be described together with the measuring system.

In the preferred embodiment shown, a control circuit 5 delivers control signals to an electronic power switch unit 6 through a conductor M and to an integrator 7 through conductor N and to positive peak detector 8 and negative peak detector 9 through wires T and V, respectively. These detectors are Burr-Brown Models 3523. As it will be described with reference to FIG. 5, the switching unit 6 is connected to the secondary winding terminals A' and B' of current transformer TI, the residual flux value of which is to measured. The peak detectors 8 and 9 feed an adding circuit 10, the output of which provides the induction saturation value, and a substraction circuit 11 which generates an output signal corresponding to the residual flux value in the current transformer core. A demagnetization indicating circuit 12 receives signals from the substracting circuit 11 through wire H and from the integrating circuit 7 through wire C to provide at its output an indication of the value of the direct current which is to be injected through the transformer winding or demagnetising core thereof. The circuits 10, 11 and 12 are summing or difference amplifiers Model MC 1741G of Motorola.

A manual rotatable step switch 13 receives the various signals from the adding circuit 10, from the substracting circuit 11 and from the demagnetizing level indicating circuit 12, through wires I, J or K, respectively, and feed an amplifying and calibrating circuit 14 (Motorala Model MC 1741G) which is connected to a display circuit 15. Moreover, when the step switch 13 is positioned on its input contact B", the power switching circuit 6 is then linked to a D.C. supply source through wire P when the demagnetization process of the transformer core is in operation.

Under the action of the control circuit 5, the system operates following one of the operation modes selected by means of the push button switch 16 the number of contacts which has been maintained as low as possible in order to facilitate the various operation modes by an operator. Thus, pressing the reset button reset will trigger a double action at the level of the control circuit 5; it will first reset to zero the circuit section controlling a new start, and secondly will deliver a pulse to the integrating circuit 7 and to the peak detectors 8 and 9 for resetting them to zero. In addition, by pressing the START button, the control circuit 5 delivers a pulse to the peak detector circuits 8 and 9 through wires T and V, respectively, so that the memory of these detectors is prepared to receive new content. Also, depressing the START button will deliver to the power switching unit 6 a two positive period signal which energizes either one of the electronic switches (see FIG. 5) allowing the current to flow in one direction and thereafter in the other direction through the secondary winding of the current transformer. As to switches DEM1 and DEM2, they directly control the switching unit 6 for permitting the injection of a D.C. current, positive or negative, through the transformer secondary winding in order to cause demagnetization of the transformer core.

The control circuit 6 also receives an information signal from the power switching unit 6 through wire 0, which information signal is used by the resistance compensating circuit for stopping integrator 7 when the current flowing through the transformer reaches 80% of its value. Such procedure prevents the integration of the error voltage due to the system series resistances formed by the circuit resistances, the transformer winding resistance and the wiring.

The function of integrator 7 is to integrate the voltage appearing across the transformer winding terminals, which is the output voltage of the power switching unit 6. The output signal from the integrator 7 appearing on conductor S is set into memory in the peak detectors 8 or 9 whether a positive or negative voltage value glowing through the transformer winding. The voltage value in memory in the positive peak detector 8 then corresponds to $\Delta B_1$ and that in the memory of the negative peak detector 9 to $\Delta B_2$. Those values $\Delta B_1$ and $\Delta B_2$ are thereafter connected to the adding circuit 10 and the subtraction circuit 11 which respectively supply a signal representative of the saturation flux and of the residual induction in the current transformer.

Furthermore, the various signals received by step switch 13 are selected and directed to the calibration amplifier 14, the gain of which may be varied by means of a calibrating potential meter (not shown), and then the value of those signals are displayed on meter 15.

Figure 4:
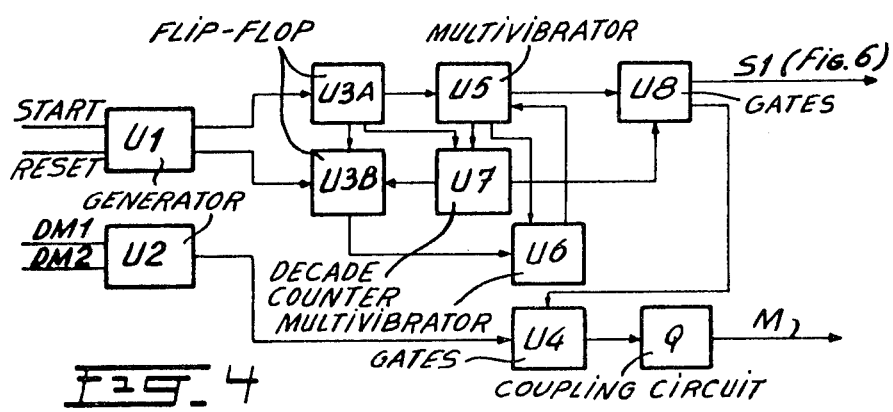

FIG. 4 illustrates the arrangement of the various elements forming the control circuit 5 of FIG. 3. The circuit comprises two Schmitt type generators U1 and U2 (COSMOS logic integrators) which deliver pulse signals when one of the push button switches 16 is activated. The generator U1 operates when the START switch or RESET switch is pressed during the measuring process of the residual flux in a current transformer whereas generator U2 is set into operation when switch DM1 or DM2 is pressed in order to start the demagnetization of the transformer core.

The generator U1 feeds two J-K flip-flop U3A and U3B (RCA Model CD 4027). Flip-flop U3A resets the monostable multivibrator U5 (RCA Model CD 4047), the flip-flop U3B, the Johnson type decade counter U7 and, also triggers positively the monostable multivibrator U5. As to flip-flop U3B, its function is to reset the monostable multivibrator U6 (RCA Model CD 4047), which controls a blocking operation after five seconds. The monostable multivibrator U5 operates to fire the positive gate of monostable U6, to start the clock of the decade counter U7 and to deliver on impulse towards a NON-AND gate U8 (RCA Model CD 4011). Monostable multivibrator U6 delivers a signal to the negative gate of the monostable multivibrator U5. Those two monostables U5 and U6 form an astable trigger circuit and control the duration of the output pulses directed to the power switching unit. As to the decade counter U7, the latter causes changes of the state of gates U8 and controls the start of the clock included in flip-flop U3B. The NON-AND gates U8 deliver pulses to NOR gates U4 (RCA Model 4001) and to a switch S1 of the integrating circuit of FIG. 6. On the other hand, NOR gate U4 receives signals from gates U8 and from generator U2, and deliver signals to bias the transistors forming the Darlington coupling circuit Q (Motorola Model 3904) which generates one or more information signals to the optocouplers of the power circuit of FIG. 5 through conductor M.

The control circuit also includes a resistance compensating circuit which is illustrated in FIG. 4a. The compensating circuit functions to stop the integration of the voltage at the secondary of the transformer when the current flowing therein reaches 80% of the core saturation value. The compensating circuit is formed of an optocoupler U9 (Hewlitt-Packard Model 5082-4350) which receives an input signal through conductor 0 from the power switching unit of FIG. 5. That signal is a voltage signal which is directly proportional to the current flowing in the secondary winding of the transformer. The latter voltage is thereafter compared with a reference voltage the value of which is 80% of the saturation current, by means of the voltage comparator U10 (National Semiconductor Model LM311). As soon as the voltage goes beyond the reference voltage, a signal is directed to switch S2 of the integrating circuit of FIG. 6 to break-off the integrating operation. When the voltage goes below 80% of its saturation value, no voltage remains at the output of the voltage comparator U10 and the switch S2 is closed. Thus, the series resistance is compensated since the integration is stopped before any increase of the voltage across the series resistance terminals caused by saturation in the transformer.

The power switching circuit 6 of FIG. 1 is shown in detail in FIG. 5. We know, that when a measure is taken, the control signal generator from the control circuit 6 through conductor M represents the measuring cycle, the total duration of which is of approximately 3 seconds. That control signal is applied across the input of either one of the optocouplers U13 and U14 (Monsanto Model EL 100). A series of current inverters U12 (National Semiconductor Model) thereafter receive an output impulse from each optocouplers and bias in a two-by-two manner the Darlington coupling circuits Q1 to Q4 (Motorola Model MJ 3001), the coupling being affected two-by-two, that is Q1 and Q4 or Q2 and Q3. Therefore, their current is allowed to flow in one direction or in the other only (positive or negative) through the current transformer secondary winding which is connected to the output terminals A' and B' of the power switching unit. Resistance R3 limits the current in the current transformer when the rotatable switch 13 is in the demagnetization position, whereby a better control of the demagnetization is achieved. In this case, if the start switch is actuated, a fairly weak current will flow through the transformer winding, which will be insufficient for saturing the core thereof in both polarities. However, when the step switch 13 is in contact with the output I of the adding circuit 10, resistance R3 is short-circuited. In addition, parallel resistances R1 and R2 serve to limit the current through the transformer winding whereas diodes CR2, CR3, CR4 and CR5 are used to cancel out overvoltages when the circuit is not energized, those overvoltages being caused by the energy stored in the transformer in the form of magnetic field.

The output voltage from the power switching unit 6, which is the voltage appearing across the transformer winding, feeds a group of circuits, herein called a processing unit, which is formed of integrator 7, detectors 8 and 9, adder 10, subtractor 11 and of the demagnetization circuit 12. The voltage appearing across the transformer winding terminals A' and B' is applied to the input of the integrator U21 (Burr-Brown chopper-stabilizer Model 3491-14) when switch S2 is closed, the latter switch being controlled by the series resistance compensating circuit shown in FIG. 4a. A series of capacitors CP (arranged in accordance with the type of current transformer to be demagnetised) is connected in parallel with the integrator U21 and also with switch K1. The latter switch is controlled by a pulse issued from circuit U1 of the control circuit of FIG. 4, through conductor N, when the RESET push button switch is actuated. Similarly, switch S1 is closed by the gate circuit U8 of the control circuit of FIG. 4 when the control circuit delivers pulses towards the power switching unit 6. It is to be noted that in the demagnetization mode, switch S1 always remains open. According to the polarity of the output voltage from the integrator U21, that voltage is directed to either one of the peak detectors 8 or 9. Detector 8 is formed of amplification units U25 and U26 (Motorola Model 1741 G and Burr-Brown Model 3523) and of memory circuit MO (capacitors) whereas detector 9 comprises the amplifying circuits U22 and U23 (Motorola Model 1741 G and Burr-Brown Model 3523) and of the memory circuit ME (capacitors). In those detectors, the amplifiers U23 and U26 act as buffer units. The memory units ME and MO include capacitors (not shown) which store the positive or negative voltage signals from the integrator U21. Those capacitors are discharged when the control circuit 5 forwards a reset signal to the peak detectors through conductors T and V, respectively.

Circuit 11 adds the positive voltage issued from amplifier U26 and the negative voltage from the output of amplifier U23. That circuit 11 is in fact an amplifier and generates at its output a signal representative of the residual induction value of the current transformer, which value is expressed by:

$$B_r = (\Delta B_1 - \Delta B_2)/2$$

On the other hand, the adding circuit 10 is an amplifier which receives through its inverse input the output negative voltage from amplifier U23, and through its non inverted input the positive voltage from amplifier U26 in order to produce at its output I a signal representative of the saturation induction of the current transformer, which is expressed by:

$$B_s = (\Delta B_1 + \Delta B_2)/2$$

The demagnetisation value indicating circuit 12 is also an amplifier which generates an output signal, the value of which corresponds to the amount of the current, positive or negative, to be injected through the current transformer winding for demagnetising same, that is to set to zero the residual flux level in the transformer core. To determine the value of the direct current to be injected in that winding, there is used the value of the residual flux Br together with the value of the current ΔI remaining the integrator U21. The residual flux is applied to the positive terminal of amplifier 12 whereas ΔI is applied to its negative terminal. The sum of those two values will have to be equal to zero at the end of the demagnetisation process which is carried out by injecting direct current impulses through the transformer winding. Those direct current impulses may be negative or positive as push button switches DM1 or DM2 is actuated whereby the residual flux in the transformer is brought to a null value. It is to be noted that the demagnetization of the transformer core only requires a D.C. supply source of 12 volts.

It is understood that the present invention also incorporates any obvious modifications of the measuring and demagnetizing method as well as the system to carry out the method described above, provided such modifications are within the scope of the appended claims.

I claim:

1. A system for measuring the residual flux in a current transformer, comprising:
   control circuit means generating a voltage waveform having two successive levels for reversing current flow in said current transformer, said control circuit means having a series resistance compensating circuit connected across the transformer winding and generating a stop signal to a processing unit upon detection of a predetermined current value flowing in said winding;
   switching circuit means connected to said winding of said current transformer and producing an induction variation from the residual flux level up to saturation by successively switching the current when said voltage waveform is applied across the terminals of said winding; and
   said processing unit receiving from said switching circuit means a first analog signal representative of said induction variation caused by said voltage waveform generated in a first time period and a second analog signal representative of the induction variation caused by said voltage waveform generated in a second time period, said unit determining saturation levels corresponding to a positive variation and to a negative variation of the induction in relation with said residual flux, and generating a signal representative of said current transformer residual flux.

2. A measuring system as claimed in claim 1, including a demagnetization circuit operating with said switching circuit means for feeding said transformer winding with a direct current, in accordance with a control signal delivered by said control circuit means.

3. A measuring system as claimed in claim 1, wherein said processing unit includes an integrating circuit for integrating said first signal and said second signal representative of said induction variation and delivered by said switching circuit means.

4. A measuring system as claimed in claim 3, wherein said processing unit comprises a positive peak detector set by a positive signal from said integrating circuit, and a negative peak detector receiving a negative signal from said integrating circuit.

5. A measuring system as claimed in claim 4, wherein each of said peak detectors includes a memory circuit for storing signals generated by said integrating circuit.

6. A measuring circuit as claimed in claim 5, wherein the memory circuits are reset to zero by a control signal from said control circuit means.

7. A measuring system as claimed in claim 4, wherein said processing unit comprises an adding circuit fed by a positive signal from said positive peak detector and a negative signal delivered by said negative peak detector whereby to generate said signal representative of said residual flux.

8. A measuring system as claimed in claim 7, wherein a positive and negative signals from said peak detectors also feed a second adding circuit which produces an output signal representative of the saturation flux of said current transformer.

9. A measuring circuit as claimed in claim 7, wherein said switching circuit means include a demagnetizing circuit for demagnetizing the transformer, said demagnetizing circuit operatively injecting a direct current through said transformer winding, and wherein a circuit for determining the value of the direct current to be injected is set by said signal representative of said residual flux delivered from said adding circuit and by a residual value of the output signal from said integrating circuit.

10. A measuring circuit as claimed in claim 8 or 9, wherein a display unit selectively displays the signal values delivered by said integrating circuit, said first adding circuit, said second adding circuit and said demagnetization value determining circuit.

11. A method for measuring the residual flux in a current transformer, comprising the steps of:
generating a voltage waveform having two successive levels for reversing current flow in said current transformer;
varying the induction level from a residual flux level up to saturation in one polarity and thereafter up to saturation in the other polarity by switching over said voltage waveform applied to a winding of said current transformer;
determining, by means of a processing unit, a variation value of the induction caused by the voltage waveform issued in the first time period and an induction value caused by a voltage waveform issued in the second time period and summing up said induction values whereby to obtain a resultant analog signal representative of said residual flux in said transformer;
said processing unit having a control circuit comprising a series resistance compensating circuit connected across the transformer winding, and
generating a stop signal to a processing unit upon detection of a current value flowing in said winding.

12. A method as claimed in claim 1, characterized in that the voltage waveform comprises a square waveform of a predetermined period.

13. A method as claimed in claim 11, characterized in that following the measuring of the residual induction, a direct current is injected through the transformer winding for bringing said residual flux to a null value.

14. A method as claimed in claim 11, characterized in that the determining step includes the steps of integrating each induction variation value and setting into memory the integrated values.

* * * * *